United States Patent
Fordham et al.

(10) Patent No.: US 10,502,548 B2
(45) Date of Patent: Dec. 10, 2019

(54) SENSOR COMBINATION

(71) Applicant: Google LLC, Mountain View, CA (US)

(72) Inventors: Paul Lynn Fordham, Wauconda, IL (US); David Kyungtag Lim, Glenview, IL (US)

(73) Assignee: Google LLC, Mountain View, CA (US)

( * ) Notice: Subject to any disclaimer, the term of this patent is extended or adjusted under 35 U.S.C. 154(b) by 201 days.

(21) Appl. No.: 15/590,123

(22) Filed: May 9, 2017

(65) Prior Publication Data
US 2018/0328717 A1  Nov. 15, 2018

(51) Int. Cl.
*G01B 11/02* (2006.01)
*G01B 7/02* (2006.01)
(Continued)

(52) U.S. Cl.
CPC ............ *G01B 11/026* (2013.01); *G01B 7/023* (2013.01); *G01B 21/02* (2013.01); *H01L 27/14601* (2013.01); *H04M 1/0264* (2013.01); *H04N 5/225* (2013.01); *H04N 5/2252* (2013.01); *H04N 5/2257* (2013.01); *G01S 13/04* (2013.01);
(Continued)

(58) Field of Classification Search
CPC ...... G01B 11/026; G01B 7/023; G01B 21/02; G01B 7/00; G01B 7/14; G01B 7/30; H01L 27/14601; H04M 1/0264; H04M 1/0277; H04M 2250/12; H04N 5/225; H04N 5/2252; H04N 5/2257; H04N 5/33; H04N 5/335; H04N 13/254; G01S 13/04; G01S 17/026; G06F 3/0304; G06F 3/0325; G06F 3/044; G01N 22/00; G01N 27/72; G01N 27/82; G01R 27/26; G01R 27/2605; G01R 33/02; G01R 33/00; G01R 33/0035; G01R 33/0047; G01R 33/0322; G01R 33/0327;
(Continued)

(56) References Cited

U.S. PATENT DOCUMENTS 5,319,205 A  6/1994 Kline et al.
8,618,482 B2  12/2013 Katz et al.
(Continued)

FOREIGN PATENT DOCUMENTS

WO  2015/167514  11/2015
WO  2016/137214  9/2016

OTHER PUBLICATIONS

International Search Report and Written Opinion issued in International Application No. PCT/US2018/012972, dated May 24, 2018, 17 pages.

*Primary Examiner* — Patrick Assouad
*Assistant Examiner* — Robert P Alejnikov, Jr.
(74) *Attorney, Agent, or Firm* — Fish & Richardson P.C.

(57) ABSTRACT

A sensor system includes a housing having a front surface and a rear surface. The housing defines a bore that extends from the front surface toward the rear surface and that includes one or more lenses. The housing includes an image sensor adjacent at least a first lens and that is aligned with the bore. The system includes a proximity-sensing device mounted on the front surface of the housing. The system further includes a conductor element shared by the proximity-sensing device and the image sensor. The conductor element provides an electrical connection between (i) at least one circuit board of an electronic device and (ii) the proximity-sensing device and the image sensor.

22 Claims, 4 Drawing Sheets

(51) Int. Cl.
*G01B 21/02* (2006.01)
*H01L 27/146* (2006.01)
*H04M 1/02* (2006.01)
*H04N 5/225* (2006.01)
*G01S 17/02* (2006.01)
*G06F 3/03* (2006.01)
*G01S 13/04* (2006.01)

(52) U.S. Cl.
CPC .......... *G01S 17/026* (2013.01); *G06F 3/0304* (2013.01); *G06F 3/0325* (2013.01); *H04M 1/0277* (2013.01); *H04M 2250/12* (2013.01)

(58) Field of Classification Search
CPC ...... G01R 33/10; G01R 33/1284; G01D 5/14; G01D 5/145; G01D 5/2033; G01D 5/2241
USPC .... 324/644, 207.11, 207, 13, 260, 658, 662, 324/207.13
See application file for complete search history.

(56) References Cited

U.S. PATENT DOCUMENTS

| | | | |
|---|---|---|---|
| 8,712,485 B2 | 4/2014 | Tam | |
| 9,179,063 B1 | 11/2015 | Vegh | |
| 9,307,129 B2 * | 4/2016 | Oh | H04N 5/2254 |
| 9,748,995 B2 * | 8/2017 | Chen | H04B 1/3838 |
| 2010/0225755 A1 * | 9/2010 | Tamaki | H04N 5/2254 |
| | | | 348/78 |
| 2014/0099994 A1 | 4/2014 | Bishop et al. | |
| 2014/0357251 A1 | 12/2014 | Forutanpour et al. | |
| 2015/0296106 A1 * | 10/2015 | Oh | G02B 27/646 |
| | | | 348/208.11 |
| 2016/0050346 A1 * | 2/2016 | Liu | G06F 3/0304 |
| | | | 348/46 |
| 2016/0050351 A1 * | 2/2016 | Lee | H04N 5/2252 |
| | | | 348/221.1 |
| 2016/0057578 A1 | 2/2016 | Rouaissia et al. | |
| 2016/0182892 A1 * | 6/2016 | Ko | G01S 17/89 |
| | | | 348/46 |
| 2016/0320585 A1 * | 11/2016 | Park | G02B 27/646 |
| 2018/0031728 A1 * | 2/2018 | Han | G01J 1/42 |

* cited by examiner

SENSOR COMBINATION

BACKGROUND

Electronic devices may include one or more sensors that are supported by a housing of the electronic device. These sensors may also be configured for placement within a certain location of an electronic device. An electronic device housing may support, for example, multiple optical elements, such as a lens stack and an image sensor.

Electronic devices, such as mobile phones and digital cameras, often include one or more camera modules that receive, from a circuit board of the electronic device, electrical signals related to the capturing of image and video content. In some electronic devices, a lens stack and an image sensor may be part of a camera module disposed within an electronic device. A camera module that includes an imaging sensor may be electrically connected to a circuit board of the electronic device and may be spaced apart from other device sensors that are also electrically connected to the circuit board.

SUMMARY

Improvements to existing camera modules and associated sensor systems for electronic devices are described below. Sensor systems for an electronic device according to the disclosed technologies may embody modifications to an example front-facing camera module of the electronic device. Such sensor systems may be configured for placement within a particular location of an electronic device. Such sensor systems may include a housing, a proximity-sensing device disposed on a surface of the housing, and an image sensor and multiple optical elements (e.g., lenses) disposed within a bore defined by the housing.

In some embodiments according to the disclosed technologies, a proximity-sensing device of an electronic device detects or senses the presence of an object within a predefined proximity of an electronic device. In such embodiments, the proximity-sensing device may include a first sensor feature (e.g., a transmitter antenna) that transmits a first signal and a second sensor feature (e.g., a receiver antenna) that receives a second signal. The second signal may be associated with the first signal.

In some embodiments according to the disclosed technologies, an electrical connector, such as a flexible flat cable, may be disposed adjacent a sidewall of a housing of an electronic device. The connector may include multiple conductors for exchanging signal communications between a circuit board of an electronic device and each of a proximity-sensing device and an image sensor disposed in the electronic device. A sensor system as described above may provide a combined proximity and imaging system that enables co-location of multiple sensors to increase or optimize available internal space within an electronic device.

One aspect of the subject matter described in this specification can be embodied in a sensor system. The sensor system includes: a housing having a front surface and a rear surface, the housing defining a bore that extends from the front surface toward the rear surface; one or more lenses located within the bore; an image sensor adjacent at least a first lens, the image sensor being aligned with the bore; a proximity-sensing device mounted on the front surface of the housing; and a conductor element that provides an electrical connection between (i) at least one circuit board of an electronic device and (ii) the proximity-sensing device and the image sensor.

These and other implementations can each optionally include one or more of the following features. For example, in some implementations, the proximity-sensing device includes at least one transceiver that: (i) transmits a first wireless signal; and (ii) receives a second wireless signal to detect presence of an object relative to the sensor system, the second wireless signal being received in response to transmission of the first wireless signal and being associated with the first wireless signal.

In some implementations, the at least one transceiver of the proximity-sensing device is: disposed at least partially in a first depression of the housing; and laterally offset from an axis that is traverse at least a second lens of the one or more lenses located in the bore. In some implementations, the proximity-sensing device includes: (i) a transmitter that transmits a first wireless signal; and (ii) a receiver that receives a second wireless signal to detect presence of an object relative to the sensor system, the second wireless signal being received in response to transmission of the first wireless signal and being associated with the first wireless signal.

In some implementations, the housing includes: six sides, the front surface accounting for at least a first side of the six sides and the rear surface accounting for at least a second side of the six sides; and a depression configured to receive the transmitter of the proximity-sensing device or the receiver of the proximity-sensing device. In some implementations, the transmitter is disposed at least partially in the depression of the housing and adjacent at least one side of the six sides of the housing; and the receiver is disposed at least partially in a second depression of the housing and adjacent at least one side of the six sides of the housing. In some implementations, the proximity-sensing device is one of: an electromagnetic wave sensing device; a capacitive sensing device; an inductive sensing device; or an optical sensing device.

In some implementations, the sensor system is configured for placement within a housing of an electronic device, the electronic device including a front-facing camera and a rear-facing camera, and the sensor system is at least a portion of the front-facing camera. In some implementations, the conductor element is: (i) an electrical connector having one or more signal paths to enable the proximity-sensing device to transmit one or more signals; (ii) disposed adjacent the rear surface of the housing; and (iii) disposed adjacent a sidewall of the housing that is between the front surface and the rear surface. In some implementations, the electrical connector is a flexible flat electrical connector that includes multiple parallel electrical conductors.

In some implementations, the housing includes: a first set of conductor traces that provide one or more signal paths to enable the proximity-sensing device to receive electrical communications using one or more signals; and a second set of conductor traces that provide one or more signal paths to indicate receipt of one or more signals received by the proximity-sensing device. In some implementations, the housing is a molded interconnect device that: includes the first set of conductor traces integrated with the housing, and includes the second set of conductor traces integrated with the housing.

In some implementations, the first set of conductor traces and the second set of conductor traces were each generated using laser direct structuring. In some implementations, the image sensor is part of at least one camera of a mobile device, and multiple lenses of the camera are optical elements for capturing an image using the at least one camera of the mobile device. In some implementations, the sensor system is a dual-purpose sensing system configured to: sense a proximity of an object using the proximity-sensing device; and generate an optical image of the object using the image sensor.

One aspect of the subject matter described in this specification can be embodied in a sensor system of an electronic device. The sensor system includes: a housing having a front surface and a rear surface, the housing defining a bore that extends from the front surface toward the rear surface; one or more lenses disposed in the bore and for capturing an image using the electronic device; an image sensor positioned to receive light that passes through the one or more lenses; a sensing device mounted on the front surface of the housing and that is capable of detecting the proximity of an object relative to the electronic device; and a conductor element adjacent the housing to provide an electrical connection between (i) a circuit board of the electronic device and (ii) the sensing device and the image sensor.

These and other implementations can each optionally include one or more of the following features. For example, in some implementations, the sensing device includes at least one transceiver that: (i) transmits a first wireless signal; and (ii) receives a second wireless signal to detect presence of an object relative to the electronic device, the second wireless signal being received in response to transmission of the first wireless signal and being associated with the first wireless signal. In some implementations, the at least one transceiver of the sensing device is: disposed at least partially in a first depression of the housing, and disposed adjacent at least one lens of the one or more lenses included in the bore.

In some implementations, the sensing device includes: (i) a transmitter that transmits a first wireless signal; and (ii) a receiver that receives a second wireless signal to detect presence of an object relative to the electronic device, the second wireless signal being received in response to transmission of the first wireless signal and being associated with the first wireless signal. In some implementations, the transmitter is disposed at least partially in a first depression of the housing and adjacent at least one side of the housing; and the receiver is disposed at least partially in a second depression of the housing and adjacent at least one side of the housing.

Embodiments according to this specification can result in one or more of the following advantages. Sensor systems designed according to the disclosed technology may provide a proximity-sensing device that is nested in an outline of a front-facing camera module, thereby saving overall X-dimension and Y-dimension space within an example electronic device. In such embodiments, the sensor systems may eliminate the need to allocate space on the device's main circuit board for both the front-facing imaging system (i.e., the camera module) and the proximity-sensing device.

Further, an increase in available dimensional space within an electronic device may expand and enhance design options relating to borderless display products for a variety of electronic devices. Hence, optimization of available space within an electronic device allows for a fuller display screen (e.g., one with slim or no borders) on a front surface of the electronic device. Further, sensor systems implemented according to this specification may allow for a proximity-sensing device that can be located independent of a main circuit board's location within an electronic device. This allows for a proximity-sensing device that has more robust functionality, improves electronic device internal space utilization, and allows for a more unique cover lens design for device display screens.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
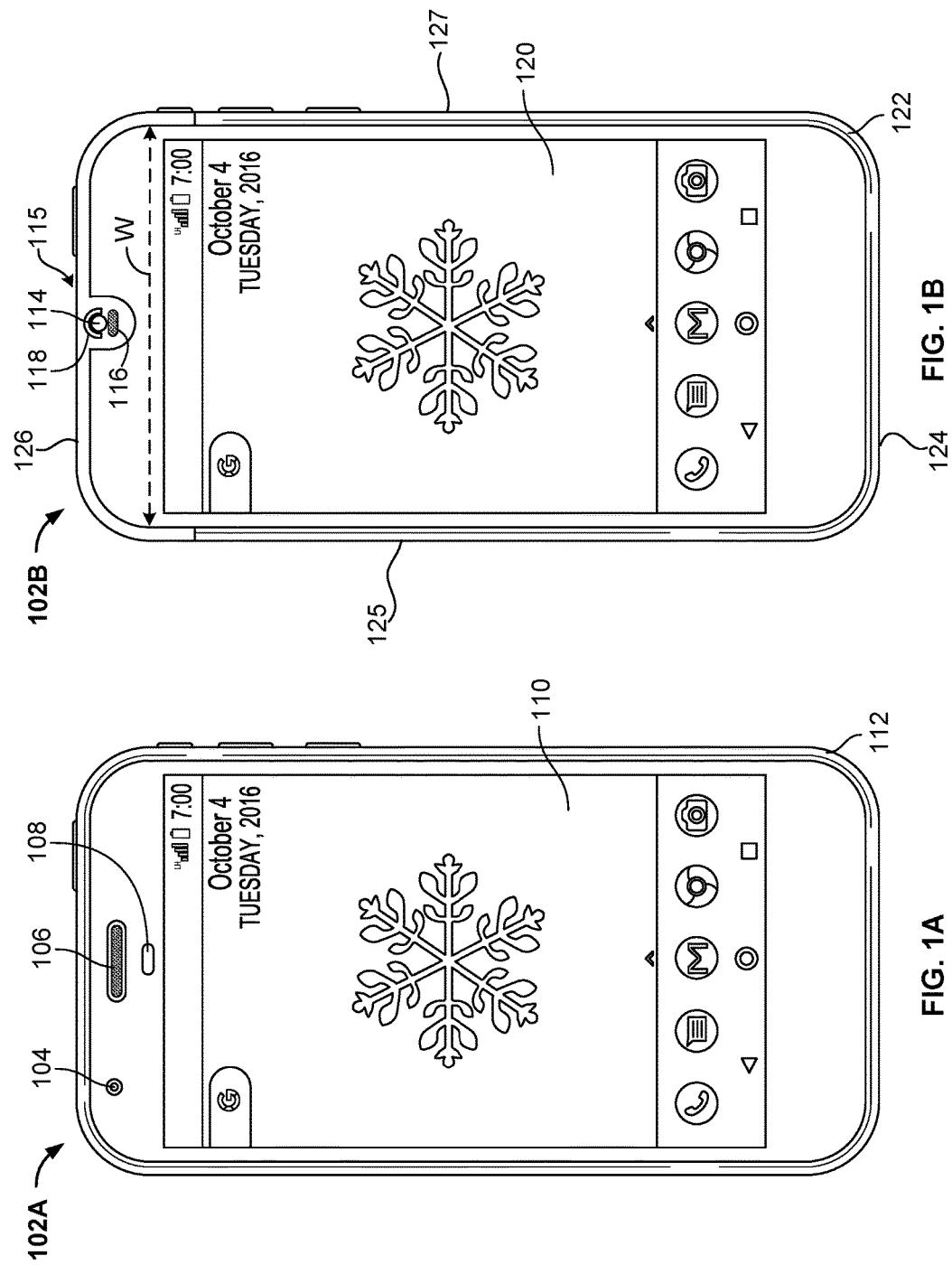
FIGS. 1A-1B illustrate example electronic devices, including at least one sensor opening disposed at a particular location of each electronic device.

Proximity-sensing devices (e.g., one or more proximity sensors) for electronic devices may utilize transmitters and receivers to sense, for example, the presence of an object (such as user's head) during active device use (e.g., during a telephone call). A proximity-sensing device may interface with other circuit components of an electronic device to temporarily turn off a device display when an object is in close proximity to a display screen of the electronic device. When an object is no longer in close proximity to an electronic device's screen, a proximity-sensing device can cause the electronic device to re-activate (e.g., by turning on a display screen of the electronic device).

During a phone call using a mobile device, a proximity-sensing device may be used by the mobile device to mitigate undesired activation (e.g., false inputs) of device functions in response to accidental head/face touches of the device's display screen. Electronic devices that have proximity-sensing devices may also include front-facing cameras that include an image sensor. These front-facing cameras are often separate components disposed within the electronic device and are often placed at a location that differs from a location of the proximity-sensing device.

However, with industry design practices for electronic devices trending toward borderless displays, mechanisms to minimize and/or consolidate space usage within electronic devices are desired. These goals can be achieved using a sensor system that co-locates multiple sensors within a particular internal area of an electronic device. Accordingly, embodiments of the disclosed technology include a sensor system for an electronic device that co-locates at least a proximity-sensing device and an image sensor.

According to the disclosed technologies, a sensor system may include multiple sensors disposed at a single internal location of an electronic device (e.g., a mobile phone), such that less total space is occupied by these components within the electronic device. For example, a camera module that includes an image sensor used by an electronic device may include unused space at the corners of its housing. One or more components of a proximity-sensing device may be disposed at or on this unused space to provide a sensor system that combines multiple sensors, such as a proximity-sensing device and an image sensor. Further, a sensor system that includes multiple sensors which have a certain orientation within an electronic device, and that are disposed at a particular location within the device, may improve one or more external aesthetic features of the electronic device.

Further, sensor systems according to the disclosed technology may include a housing having a front surface and a rear surface. The housing may define a bore that extends from the front surface toward the rear surface. A sensor system may further include a first sensor feature and a second sensor feature that collectively form a proximity-sensing device. The first and second sensing feature may each be disposed at respective locations on the front surface of the housing that are adjacent the bore.

The first sensor feature may be disposed at a first location on the front surface of the housing and may be configured to transmit a first signal. The second sensor feature may be disposed at a second location on the front surface of the housing and may be configured to receive a second signal that is associated with the first signal. The sensor system may be structured for placement within a housing of the electronic device.

Further, a sensor system according to the disclosed technology may include an image sensor disposed in a bore of a housing of the sensor system. First and second sensor features and the image sensor may each be configured for electrical coupling to a circuit board of an electronic device. The image sensor may be included in a camera of an electronic device and may include a plurality of optical elements for capturing an image.

A sensor system according to this specification may include an electrical connector that electrically couples a proximity-sensing device and an image sensor to a circuit board of an electronic device. Signal communications between the circuit board and each of a proximity-sensing device and an image sensor of a camera included in the electronic device may be exchanged via the electrical connector.

Referring to FIG. 1A, an example electronic device 102A is shown, including an imager opening 104, a speaker port 106, and a proximity sensor opening 108. Imager opening 104 can be for a front-facing ("FF") imager that has a camera module or camera body. Example FF imagers can include digital cameras that are disposed in the device housing of an example electronic device such as a smart phone, tablet, or related mobile computing device.

Device 102A further includes, an outer cover 110 that covers an example display lens, and an electronic device housing 112 that receives one or more components. Device 102A can include components typically associated with electronic devices, such as a battery, electrical connectors, and one or more circuit boards. Device 102A (and device 102B) can be an electronic device that includes a camera module, such as a mobile phone, mobile device, music player, tablet device, laptop computing device, wearable electronic device, data storage device, display device, adapter device, desktop computer, digital camera, or other electronic device.

Referring now to FIG. 1B, an example electronic device 102B is shown, including an imager opening 114, a speaker port 116, a proximity sensor opening 118, and a sensor system 115. Imager opening 114 can be for an example FF imager that is disposed adjacent opening 114 and that has a camera module or camera body located there within or there behind. As described in more detail below, sensor system 115 can include the FF imager and camera module as well as a proximity-sensing device that can be disposed adjacent sensor opening 118 (e.g., within a periphery of sensor opening 118 when device 102B is viewed from the front).

As shown in FIG. 1B, width W defines a width of computing device 102B that extends generally between a first side wall (e.g., side portion 125 discussed below) and a second sidewall (e.g., side portion 127 discussed below) of the device 102B. In some implementations, a location and/or orientation of imager opening 114, proximity sensor opening 118, and sensor system 115 can vary along width W of computing device 102B. Likewise, in some implementations, a location or orientation of speaker port 116 can vary also along width W of computing device 102B.

Device 102B further includes an outer cover 120 that covers an example display lens, and an electronic device housing 122 that receives one or more components. Device 102B can be substantially the same as device 102A and can include components typically associated with electronic devices, such as a battery, electrical connectors, and one or more circuit boards. Electronic device housing 122 may be a bucket-type enclosure having first, second, third, and fourth side portions 124, 125, 126, 127 that define outer sidewalls of electronic device 102B.

A bucket-type enclosure allows components of electronic device 102B to be accommodated within housing 122 and enclosed by outer cover 120. In various implementations, electronic device housing 122 may be an H-beam type housing or other electronic device housing 122 that includes one or more walls that provide a housing to at least partially support and/or enclose components of electronic device 102B.

Electronic device housing 122 is made from a material that provides adequate structural rigidity to support and protect internal components of electronic device 102B. In some implementations, housing 122 is formed from a single piece of metal. Housing 122 may be milled, molded, forged, etched, printed, or otherwise formed. Alternatively, or additionally, housing 122 may be formed from plastic, glass, wood, carbon fiber, ceramic, combinations thereof, and/or other materials.

Electronic device housing 122 and outer cover 120 define an interior volume that can house various components of electronic device 122 (e.g., battery, circuit board, and connectors, as noted above). Housing 122 can accommodate additional components of electronic device 102B, such as a microphone, speaker, and one or more sensors, such as proximity sensors, image sensors, antennas, and/or other components. In various implementations, some or all of these components may be electrically connected with an example circuit board.

Device 102A has a FF imager opening 104 that is spaced apart from proximity sensor opening 108. As indicated above, an image sensor and camera module of a FF camera may each be disposed adjacent FF imager opening 104. Likewise, at least one sensor or sensor feature of a proximity-sensing device may be disposed adjacent opening 108.

In the implementation of FIG. 1A, and with reference to component placement within housing 112, because imager opening 104 is spaced apart from sensor opening 108, the image sensor and camera module of the FF camera (i.e., that are disposed adjacent opening 104) will be also spaced apart from, and not co-located with, the at least one sensor or sensor feature of the proximity-sensing device (i.e., that is disposed adjacent opening 108).

In contrast to device 102A, device 102B includes a sensor system 115 (described below) that can be configured, structured, or designed such that at least one proximity-sensing device can be nested in a housing or outline of a FF camera module. This nesting enables components of the FF camera to be co-located with, and disposed adjacent, or substantially adjacent, components of an example proximity-sensing device.

Further, this nesting makes available X-dimension (width), Y-dimension (height), and Z-dimension (depth) space that would otherwise be used if device 102B implemented the spaced-apart internal component layout of device 102A. The available X, Y, and Z dimension space corresponds, in part, to space defined by housing 122 when outer cover 120 is secured to housing 122. Thus, use of sensor system 115 enables component and/or sensor placement that eliminates the need to allocate space for both a FF imaging system, i.e., device camera, and a separate proximity-sensing device.

Although sensor system 115 is indicated in FIG. 1B as being associated with a mobile device, and is described herein with reference to a proximity-sensing device and imager, in various alternative implementations, sensor system 115 can be configured to combine a variety of other sensors (e.g., lasers, thermistors, etc.) to achieve device space optimization. Hence, sensor system 115 can be configured to have footprint fitting dimensions that achieve space savings within electronic device use cases other than mobile devices and digital cameras.

For example, sensor system 115 can be adapted for use in electronic devices such as Wi-Fi security cameras, electronic baby monitors, or various other consumer electronic devices. In particular, these devices generally utilize internal cameras to perform core device functions and, thus, would benefit from the internal sensor space optimization afforded by the combined sensor packaging size of sensor system 115.

Figure 2:
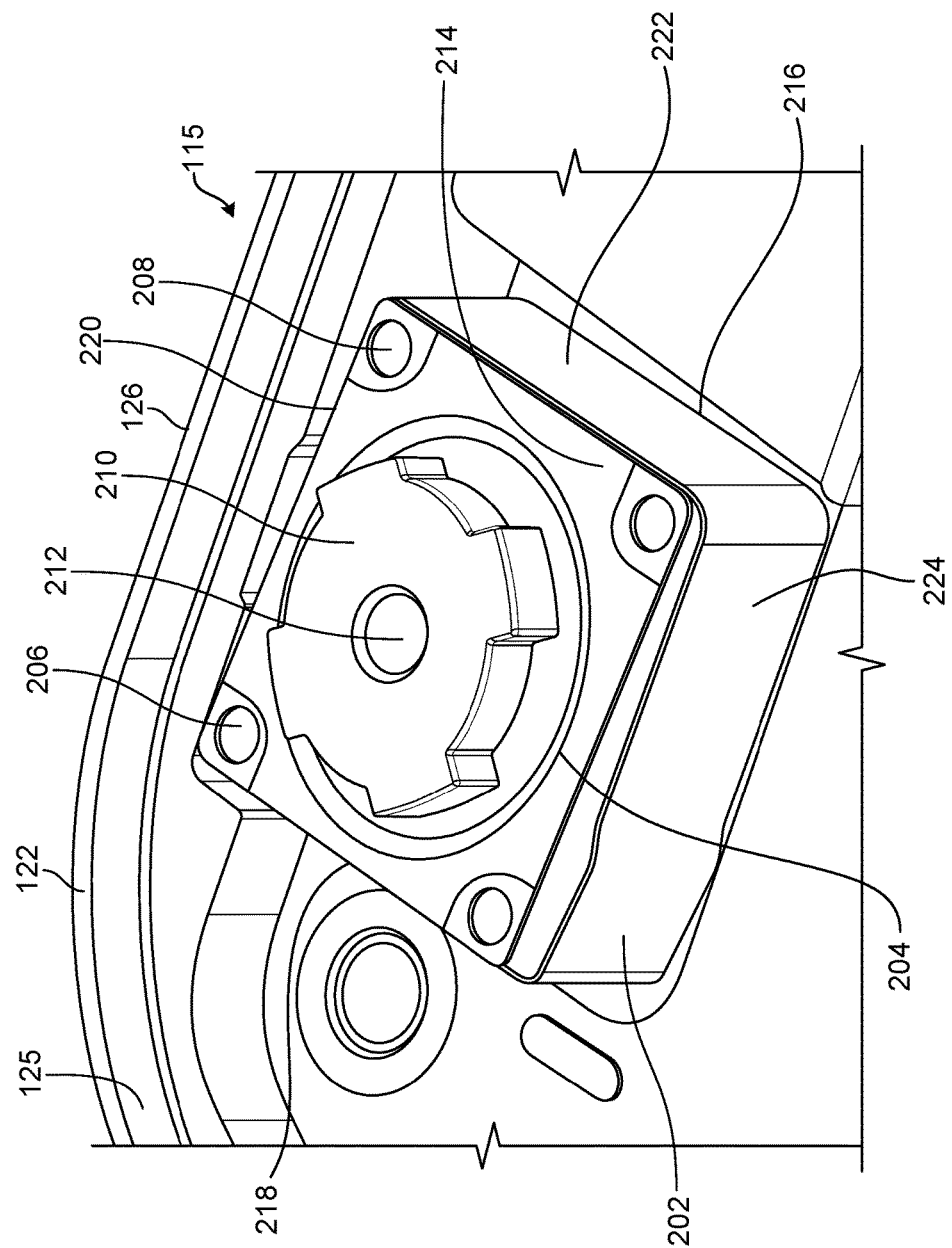
FIG. 2 illustrates an example sensor system disposed within a housing of an example electronic device.

FIG. 2 illustrates an example sensor system 115 discussed above with reference to FIG. 1B. System 115 can include at least one sensor (shown in FIG. 3) and can be disposed in housing 122 of electronic device 102B. System 115 includes a sensor system housing 202. As shown, housing 202 defines a bore 204 and can define or include depressions 206, 208. In some descriptions below, depression 206 can be referenced or described as first depression 206, while depression 208 can be referenced or described as second depression 208.

As indicated by FIG. 2, bore 204 can be a central or centralized bore of housing 202. Bore 204 is sized to receive a lens cover 210, at least one lens 212 of an example lens stack, and at least one image sensor (shown in FIG. 3B). In some instances, the image sensor is disposed within bore 204 such that the image sensor is aligned with an example central axis of bore 204. In some implementations, the at least one image sensor is disposed at a bottom of the lens stack and adjacent a least a bottom lens of the lens stack. The lens stack and image sensor are each described in more detail below with reference to FIG. 4.

Lens cover 210 aids in enclosing, covering, or protecting lens 212 and the image sensor when each item is received by bore 204. In some implementations, lens 212 (and other lenses of the lens stack) can be housed (either collectively or singularly) within a container type device, e.g., a lens barrel, sized for tight and secure placement within bore 204. Alternatively, lenses of the stack can be placed in, or received by, bore 204 without use of a container type device. In either implementation, lens cover 210 can be used to enclose and cover lenses of the lens stack and the image sensor.

Housing 202 further includes a front surface 214 (facing in a same direction as a main display of the mobile device) and a rear surface 216 that together account for at least two sides of six sides of housing 202. Housing 202 further includes sides/sidewalls 218, 220, 222, and 224 that together account for the remaining for four sides of housing 202. Bore 204 can be described as extending from front surface 214 toward rear surface 216. In some implementations, the image sensor discussed above, can be disposed at a bottom, or floor, section of bore 204 and adjacent to rear surface 216.

In general, housing 202 of sensor system 115 can correspond to an example camera module or camera module that houses a lens stack and an image sensor. The camera module can be disposed within an example electronic device and can be used by the device to capture digital images or pictures. Thus, design features of sensor system 115 can be based, in part, on a camera module that is modified or adapted to include additional component features.

The additional features enable the modified camera module to have image capture functions, while also including additional or expanded sensing functions. For example, and as discussed in more detail below, sensor system 115 can be a dual-purpose sensing system configured to: i) sense a proximity of an object using a proximity-sensing device; and ii) generate an optical image of an object using an example image sensor.

Depressions 206, 208 of housing 202 can be disposed on front surface 214. First depression 206 can be sized to receive a first sensor feature of an example proximity-sensing device. Similarly, second depression 208 can be sized to receive a second sensor feature of the example proximity-sensing device. The proximity-sensing device is described in more detail below with reference to the implementations of FIG. 3A/B.

Depressions 206, 208 can be also sized to receive portions or sections of an example flex conductor. Depressions 206, 208, can each have an interior surface section that supports at least one sensor feature and that supports certain portions of the example flex conductor. Housing 202 can include at least two such depressions (e.g., four depressions) and each depression can receive at least one sensor feature that enables various functions of sensing system 115. In some implementations, housing 202 can include fewer than two depressions.

As shown in the implementation of FIG. 2, sensor system 115 is configured for placement within housing 122 of device 102B. In some implementations, sensor system 115 can be placed adjacent at least side/sidewall 126 and at a spaced-apart distance from side wall 125 and sidewall 127 (reference FIG. 1B). In other implementations, device 102B includes a FF camera and a rear-facing camera and sensor system 115 is associated with at least the front-facing camera.

For example, when placed within device 102B, sensor system 115 can be a FF camera of the device that captures one or more digital pictures or images. Further, as indicated above, the image sensor disposed in, or adjacent, bore 204 can be used by at least one camera of device 102B (e.g., the FF camera). The at least one camera can have multiple optical elements. Lens 212 and other lenses of the lens stack correspond to the optical elements of the camera and are used, along with the image sensor, to capture images via device 102B.

FIGS. 3A and 3B illustrate different views of sensor system 115. As shown, sensor system 115 can include a proximity-sensing device 302 mounted on, attached to, or disposed on front surface 214 of housing 202. System 115 can also include an example image sensor 308 disposed generally at a bottom section of housing 202 and adjacent rear surface 216, or at a floor section of bore 204 and adjacent rear surface 216. Image sensor 308 can be for use by at least one camera of device 102B (e.g., the FF camera).

System 115 can further include a flex conductor 310 (e.g., flexible flat cable) having one or more conductor sections. In some implementations, at least one conductor section is mounted on, attached to, or disposed on front surface 214 of housing 202. Hence, flex conductor 310 is at least partially disposed on surface 214 via the at least one conductor section that is mounted on surface 214. Flex conductor 310 electrically connects at least proximity-sensing device 302 with an example circuit board of device 102B.

Flex conductor 310 includes conductive structures on a thin, flexible substrate. Flex conductor 310 can have a relatively thin profile and can be bent along a longitudinal direction to fit around or between various components of device 102B. Conductive structures of flex conductor 310 can include conductive lines, printed conductive traces, multiple parallel electrical conductors, or other conductive components that provide electrical connections between electrical contacts of sensing system 115 and the circuit board.

Figure 3:
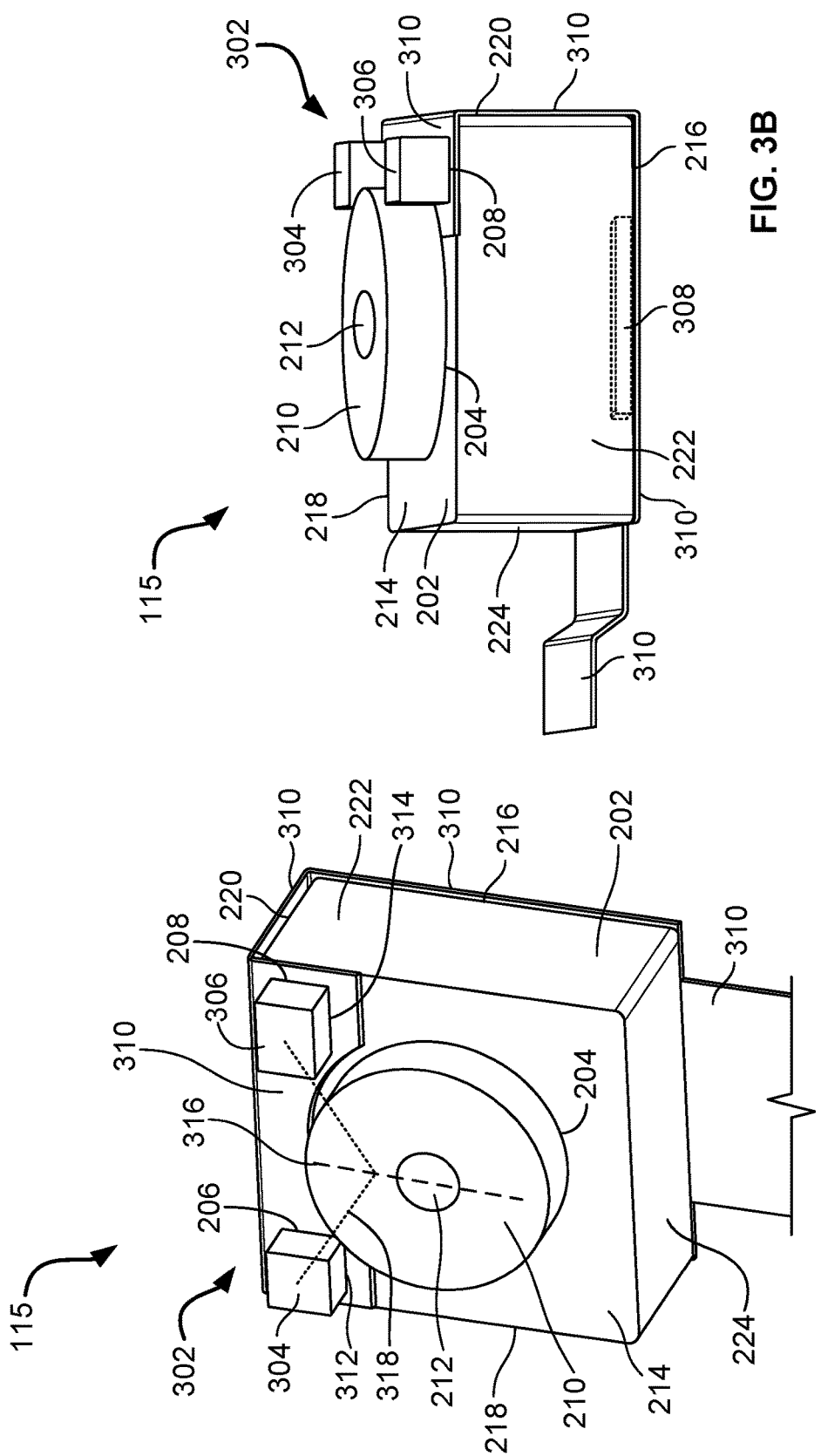
FIGS. 3A and 3B illustrate different views of a sensor system structured for placement within a housing of an example electronic device.

In the implementation of FIG. 3, flex conductor 310 bends or folds around an example edge or periphery of housing 202 to form an electrical connection with each of proximity-sensing device 302 and image sensor 308. For example, flex conductor 310 can contact, or be disposed directly adjacent, rear surface 216 of housing 202. Flex conductor 310 can also contact, or be disposed directly adjacent, sidewall 220 of housing 202. In some instances, the electrical connection of flex conductor 310 with device 302 is formed at one or more connection locations that correspond to either, or both, of depressions 206, 208.

Flex conductor 310 can be a conductor element that is shared by proximity-sensing device 302 and image sensor 308. Flex conductor 310 provides an electrical connection between a circuit board of device 102B and each of device 302 and image sensor 308. For example, flex conductor 310 can be used to provide power signals, from a power source of the example circuit board, to at least one of sensing device 302 or image sensor 308.

Additionally, flex conductor 310 is configured to exchange electrical signals, such as control signals and parameter signals, between the circuit board and each of proximity-sensing device 302 and image sensor 308. In some implementations, flex conductor 310 is an electrical connector having one or more signal paths to cause proximity-sensing device 302 to transmit at least a first signal, and to cause a circuit board of device 102B to receive or detect receipt of at least a second signal (discussed below).

Proximity-sensing device 302 can include at least two sensor features, namely, first sensor feature 304 and second sensor feature 306. As shown in FIG. 3A, a central axis 316 can be associated with one of housing 202, cover 210, or lens 212 and at least one of sensor features 304, 306 can be disposed at an angle 318 relative to central axis 316. In some implementations, at least one of sensor features 304, 306 can be laterally offset from central axis 316. In some instances, central axis 316 can be described as being traverse at least one lens of one or more lenses located in bore 204.

In some implementations, depressions 206, 208, can each have an interior surface section that each supports one of sensor feature 304 or sensor feature 306 and that supports certain portions of flex conductor 310. As noted above, depressions 206, 208 can be sized to receive portions or sections of an example flex conductor 310. Thus, sensor features 304, 306 can couple or connect to a particular portion of flex conductor 310 that is disposed at, or received by, respective depressions 206, 208.

For example, a first portion 312 of flex conductor 310 can be received by depression 206 and is attached or secured (e.g., via adhesive bonding) to an interior surface of depression 206. Likewise, a second portion 314 of flex conductor 310 can be received by depression 208 and is attached or secured (e.g., via adhesive bonding) to an interior surface of depression 208.

In some implementations, the attached first and second portions 312, 314 of flex conductor 310 can each have one or more exposed conductor traces. In the implementation of FIG. 3A/B, the exposed conductor traces are blocked/covered by respective sensor features 304, 306. The conductor traces of the attached portions 312, 314 provide connection points for establishing an electrical connection between each of sensor features 304, 306 and an example circuit board of device 102B.

For example, exposed conductor traces of the attached first portion 312 provide a connection point for electrically coupling first sensor feature 304 to the example circuit board. Likewise, exposed conductor traces of the attached second portion 314 provide a connection point for electrically coupling second sensor feature 306 to the example circuit board.

Accordingly, in some implementations, first sensor feature 304 is received by first depression 206, connected or coupled to the exposed traces of first portion 312, and/or is affixed to a surface section of depression 206, or disposed at least partially in depression 206. Likewise, second sensor feature 306 is received by second depression 208, connected or coupled to the exposed traces of second portion 314, and/or is affixed to a surface section of depression 208, or disposed at least partially in depression 208.

In some implementations, sensor features 304, 306 can be electrically connected or coupled to traces of flex conductor 310 (e.g., exposed traces of first and second portions 312, 314) via an example solder connection, using small electrical connectors, or using processes associated with Surface Mount Technology (SMT).

In alternative implementations, housing 202 does not include depressions 206, 208. In this implementation, first and second portions 312, 314 can attach directly to a flat, or substantially flat, portion of front surface 214 with respective sensor features 304, 306 being connected to respective portions 312, 314. In other implementations, instead of depressions, housing 202 can include one or more other surface attributes, such as notches, grooves, indentations, or other surface design configurations usable for attaching portions 312, 314, and sensor features 304, 306 to housing 202.

In some implementations, proximity-sensing device 302 can be at least one of: a) an electromagnetic (EM) wave sensing device; b) a capacitive sensing device; c) an inductive sensing device; or d) an optical sensing device. In other implementations, proximity-sensing device 302 can be one or more of a variety of devices configured to sense the proximity of at least a first object relative to at least a second object, or relative to device 302 itself.

Sensor features 304, 306 can have, or can be designed or configured to have, certain technical attributes for enabling the proximity sensing functions of a particular type of sensing device. For example, technical attributes of sensor features 304, 306 can include, or correspond to, at least one of: i) a radio signal antenna; ii) a capacitive probe; iii) a magnet or magnetic probe; or iv) an optical signal probe, photo sensor/detector, or laser probe.

In some implementations, each of sensor features 304, 306 can be at least one of: a signal transceiver, a signal transmitter, or a signal receiver. For example, proximity-sensing device 302 can include at least one transceiver that corresponds to either sensor feature 304 or 306. The transceiver can be configured to at least: (i) transmit a first signal for sensing a presence of an object; and (ii) receive a second signal for detecting a proximity of an object relative to: device 102B, sensor system 115, or device 302. In some implementations, detecting proximity of an object includes detecting, determining, or computing, by a computing system of device 102B, that an object is within a threshold physical distance of device 102B, sensor system 115, or proximity-sensing device 302.

In some implementations, proximity-sensing device 302 can include at least one signal transmitter and at least one signal receiver. For example, the signal transmitter can correspond to sensor feature 304, while the signal receiver can correspond to sensor feature 306. The signal transmitter can be configured to at least transmit a first signal for sensing a presence of an object, while the signal receiver can be configured to at least receive a second signal for detecting a proximity of an object relative to, e.g., sensor system 115 or device 102B.

In some implementations, proximity-sensing device 302 can be an EM wave sensing device that detects the proximity of an object using a received second signal that is based on a transmitted first signal. For example, sensor feature 304 can be a transmitting antenna that transmits an EM radio wave (e.g., a first signal), and sensor feature 306 can be a receiving antenna that receives the transmitted EM radio wave (e.g., a second signal) after the transmitted radio wave interacts with a sensed object. In some instances, a signal interacts with a sensed object by reflecting off the object.

In other implementations, proximity-sensing device 302 can be an optical based EM wave sensing device that detects the proximity of an object using a received second signal that is based on a transmitted first signal. For example, sensor feature 304 can be an infrared (IR) light emitting diode (LED) that transmits an IR light wave (e.g., a first signal), and sensor feature 306 can be a photodiode that receives or detects photons/light waves (i.e., a second signal) having a wavelength falling within the IR spectrum. For example, sensor feature 306 can detect photons of the transmitted IR light wave after the transmitted light wave interacts with, or reflects off, a sensed object.

In some implementations, a single (i.e., the same) sensor feature 304 or 306 can be a component that is used for both transmitting at least a first signal and receiving at least a second signal that is based on the first signal. In some implementations, the received second signal is associated with the transmitted first signal. For example, the transmitted first signal and the received second signal can be the same or essentially the same signal, or the received second signal can be a modified version of the transmitted first signal that has reflected off an object.

In the implementations of FIG. 3A/B, sensing system 115 is structured for placement within a device housing of an example electronic device, such as housing 122 of device 102B. Further, although two sensor features are depicted in FIGS. 3A/B (i.e., feature 304 and feature 306), in alternative implementations, proximity-sensing device 302 can include a single sensor feature, or can include four or more sensor features.

Figure 4:
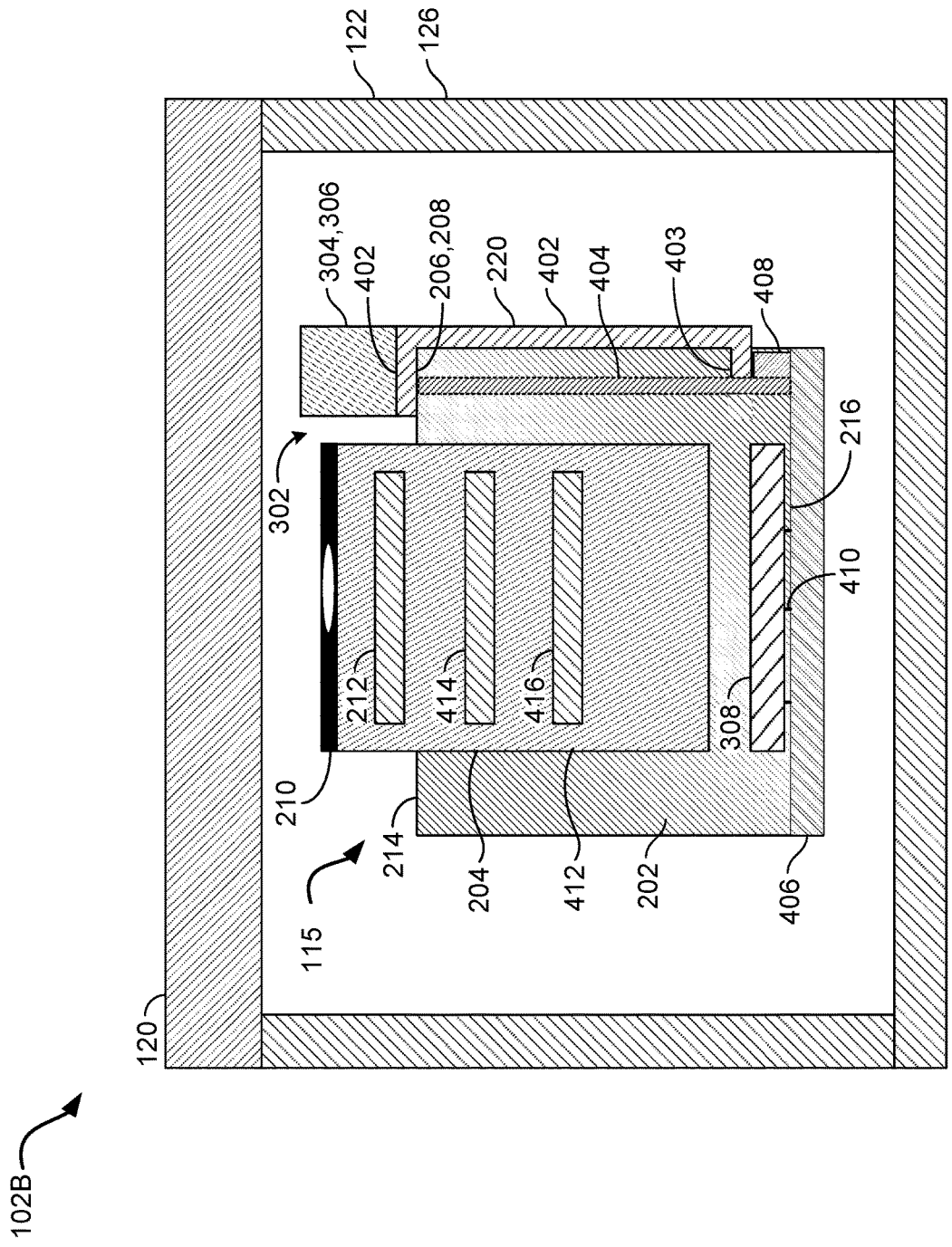
FIG. 4 illustrates a cross-sectional view of a sensor system having electrical traces that are integrated with a housing of the sensor system.

Referring now to FIG. 4, a cross-sectional view of electronic device 102B and sensor system 115 is shown. In the implementation of FIG. 4, housing 202 includes integrated electrical traces 402 and 404 and device 102B includes circuit board 406. Integrated traces ("trace(s)") 402, 404 can each have multiple conductive lines (i.e., multiple traces) that provide an electrical connection or an electrical signal path(s) between sensor features 304, 306 and circuit board 406.

In some implementations, the signal path provided by traces 404 is distinct from, and/or alternative to, the signal path provided by traces 402. For example, traces 402 can provide an electrical connection between each of sensor features 304, 306 and circuit board 406. Likewise, traces 404 can also provide an electrical connection between each of sensor features 304, 306 and circuit board 406. Thus, traces 402, 404 are each integrated trace designs that can be used alternatively.

In some implementations, the connection and signal path provided by traces 404 is distinct from, but used in conjunction with, the connection and signal path provided by traces 402. For example, traces 402 can provide an electrical connection between sensor feature 304 and circuit board 406, while traces 402 can provide an electrical connection between sensor feature 306 and circuit board 406.

Traces 402, 404 can be conductive structures, such as conductive lines, printed conductive traces, or other conductive components that provide electrical connections between electrical contacts of sensing system 115 and circuit board 406. In some implementations, each, or both, of traces 402, 404 are electrical connection design options that can be alternatives to using flex conductor 310 described above.

Each of integrated traces 402, 404 can include one or more sets of conductor traces providing one or more signal paths. Electrical signals traverse the signal paths to cause proximity-sensing device 302 to transmit one or more signals (e.g., an example EM wave), and to cause circuit board 406 to receive, or indicate receipt of, one or more signals received by proximity-sensing device 302. In some implementations, a processor and an example signal transmit/receive logic/instructions of circuit board 406 can be used by device 102B to determine properties (e.g., proximity) of an object that is sensed.

In some implementations, housing 202 is a molded interconnect device, such as an injection-molded thermoplastic part with integrated electronic circuit traces. For example, housing 202 can have a first set of conductor traces (e.g., traces 402) integrated within the housing at a first location. Alternatively, or additionally, housing 202 can have at least a second set of conductor traces (e.g., traces 404) integrated within the housing at a second location that is different than the first location. A periphery of housing 202 may have a diameter that is no larger than ½, ⅕, ¹⁄₁₀, or ¹⁄₁₅th the width of the mobile device or the length of the mobile device.

The first location can correspond to front surface 214 or at least a surface of sidewall 220, while the second location can correspond to an example path 403 that extends from depressions 206, 208, through housing 202, and toward a connector post/terminal 408 of circuit board 406. In some implementations, conductive lines of traces 402, 404 are accessible at depressions 206, 208. Thus, sensor features 304, 306 placed at depressions 206, 208 can electrically connect to conductive lines of traces 402, 404 via an example solder connection, or using processes associated with Surface Mount Technology (SMT).

In some implementations, housing 202 and traces 402, 404 are each generated or manufactured using laser direct structuring (LDS). For example, housing 202 and traces 402, 404 can be formed from injection molding a plastic feature. The injection molding process can include laser etching the plastic feature and then plating the laser etched portions. Such plating of the laser etched portions can enable molding of a housing 202 that includes conductive lines (e.g., traces 402, 404) integrated within the plastic housing substrate.

In the implementation of FIG. 4, sensor system 115 includes an example lens barrel 412 for holding lens 212 and at least two additional lenses 414, 416. Sensor system 115 further includes image sensor 308 disposed generally at a bottom section of housing 202 and adjacent rear surface 216. Lenses 212, 414, 416 can be optical elements that function to transmit light to image sensor 308. Although three lenses 212, 414, 416 are shown, in some implementations, sensor system 115 can include more or fewer lenses.

Image sensor 308 captures light focused through lens barrel 412, and communicates associated multi-pixel image data (e.g., at least 1,000 pixels by 1,000 pixels) to circuit board 406. Image sensor 308 can include a charged coupled device (CCD) image sensor, complementary metal-oxide-semiconductor (CMOS) image sensor, active pixel sensor (APS) image sensor, N-type metal-oxide-semiconductor (NMOS), combinations thereof, and/or other sensors.

In some implementations, image sensor 308 is electrically connected, or coupled, to circuit board 308 via electrical connectors 410 including wire bonds or other electrical connections that facilitate transmission of control signals and data. In other implementations, image sensor 308 can be electrically connected to circuit board 308 using conductive lines of example integrated traces that are substantially similar to traces 402, 404 discussed above.

Lens barrel 412 can include a plurality of optical elements, e.g., lenses 212, 414, 416, having optical characteristics that facilitate capture of image data by image sensor 308. The optical elements can be shaped to provide a desired optical power. For example, optical elements/lenses 212, 414, 416 can have surfaces that are planar, concave, convex, and/or aspheric in shape. In some implementations, optical elements 212, 414, 416 each have the same thickness but each have surfaces that differ in shape.

Lenses 212, 414, 416 within lens barrel 412 can be movable relative to image sensor 308, and along an optical path, to adjust an optical focus of an object onto image sensor 308. For example, lens barrel 412 can include a micro-electro-mechanical system (MEMS) actuator configured to move one or more lenses of lens barrel 412 along an optical axis. For example, movement of the one or more lenses along an optical path can cause at least one lens to move closer to, or further from, image sensor 308. In some implementations, sensor system 115 can include a voice coil motor (VCM), a piezo actuator, other actuators, and/or combinations thereof, to move at least one of lenses 212, 414, 416 relative to image sensor 308.

To provide for interaction with a user, the systems and techniques described here can be implemented on a computer having a display device, e.g., a LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

A number of embodiments have been described. Nevertheless, it will be understood that various modifications may be made without departing from the spirit and scope of the disclosed technology. Accordingly, other embodiments are within the scope of the following claims. While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

What is claimed is:

1. A sensor system, comprising:
a housing having a front surface and a rear surface, the housing defining a bore that extends from the front surface, through the housing, and substantially toward the rear surface;
one or more lenses located within the bore;
an image sensor adjacent at least a first lens of the one or more lenses that are located within the bore, the image sensor being aligned with the bore and disposed between the first lens and the rear surface of the housing;
a proximity-sensing device mounted on the front surface of the housing, wherein the proximity-sensing device is mounted at a location on the front surface that is between a periphery of the bore and a sidewall of the housing that extends between the front surface of the housing and the rear surface of the housing; and
a plurality of conductor elements configured to provide an electrical connection between:
(i) at least one circuit board of an electronic device and the proximity-sensing device, and
(ii) the at least one circuit board of the electronic device and the image sensor.

2. The sensor system of claim 1, wherein the proximity-sensing device comprises at least one transceiver that:
(i) transmits a first wireless signal; and
(ii) receives a second wireless signal to detect presence of an object relative to the sensor system, the second wireless signal being received in response to transmission of the first wireless signal and being associated with the first wireless signal.

3. The sensor system of claim 2, wherein the at least one transceiver of the proximity-sensing device is:
   disposed at least partially in a first depression of the housing; and
   laterally offset from an axis that is traverse at least a second lens of the one or more lenses located in the bore.

4. The sensor system of claim 1, wherein the proximity-sensing device comprises:
   (i) a transmitter that transmits a first wireless signal; and
   (ii) a receiver that receives a second wireless signal to detect presence of an object relative to the sensor system, the second wireless signal being received in response to transmission of the first wireless signal and being associated with the first wireless signal.

5. The sensor system of claim 4, wherein the housing comprises:
   six sides, the front surface accounting for at least a first side of the six sides and the rear surface accounting for at least a second side of the six sides; and
   a depression configured to receive the transmitter of the proximity-sensing device or the receiver of the proximity-sensing device.

6. The sensor system of claim 5, wherein:
   the transmitter is disposed at least partially in the depression of the housing and adjacent at least one side of the six sides of the housing; and
   the receiver is disposed at least partially in a second depression of the housing and adjacent at least one side of the six sides of the housing.

7. The sensor system of claim 1, wherein the proximity-sensing device is one of:
   (a) an electromagnetic wave sensing device;
   (b) a capacitive sensing device;
   (c) an inductive sensing device; or
   (d) an optical sensing device.

8. The sensor system of claim 1, wherein the sensor system is configured for placement within a housing of the electronic device, the electronic device including a front-facing camera and a rear-facing camera, and the sensor system is at least a portion of the front-facing camera.

9. The sensor system of claim 1, wherein the plurality of conductor elements:
   (i) form an electrical connector having one or more signal paths to enable the proximity-sensing device to transmit one or more signals;
   (ii) are disposed adjacent the rear surface of the housing; and
   (iii) are disposed adjacent the sidewall of the housing that is between the front surface and the rear surface.

10. The sensor system of claim 9, wherein the electrical connector is a flexible flat electrical connector that includes multiple parallel electrical conductors.

11. The sensor system of claim 1, wherein the housing comprises:
   a first set of conductor traces that provide one or more signal paths to enable the proximity-sensing device to receive electrical communications using one or more signals; and
   a second set of conductor traces that provide one or more signal paths to indicate receipt of one or more signals received by the proximity-sensing device.

12. The sensor system of claim 11, wherein the housing is a molded interconnect device that:
   includes the first set of conductor traces integrated with the housing, and
   includes the second set of conductor traces integrated with the housing.

13. The sensor system of claim 12, wherein the first set of conductor traces and the second set of conductor traces were each generated using laser direct structuring.

14. The sensor system of claim 1, wherein the image sensor is part of at least one camera of a mobile device, and multiple lenses of the camera are optical elements for capturing an image using the at least one camera of the mobile device.

15. The sensor system of claim 1, wherein the sensor system is a dual-purpose sensing system configured to:
   sense a proximity of an object using the proximity-sensing device; and
   generate an optical image of the object using the image sensor.

16. The sensor system of claim 1, wherein:
   a distance between the front surface of the housing and the rear surface of the housing is defined by a first distance; and
   the bore extends from the front surface, through the housing at a central axis of the housing, and substantially toward the rear surface such that the bore extends beyond one-half of the first distance.

17. The sensor system of claim 1, wherein the plurality of conductor elements are further configured to provide an electrical connection between the proximity-sensing device and the image sensor.

18. A sensor system of an electronic device, comprising:
   a housing having a front surface and a rear surface, the housing defining a bore that extends from the front surface, through the housing, and substantially toward the rear surface;
   one or more lenses disposed in the bore and for capturing an image using the electronic device;
   an image sensor positioned to receive light that passes through the one or more lenses, wherein the image sensor is aligned with the bore and disposed between the first lens and the rear surface;
   a sensing device mounted on the front surface of the housing and that is capable of detecting the proximity of an object relative to the electronic device, wherein the proximity-sensing device is mounted at a location on the front surface that is between a periphery of the bore and a sidewall of the housing that extends between the front surface of the housing and the rear surface of the housing; and
   a plurality of conductor elements adjacent the housing to provide an electrical connection between:
   (i) a circuit board of the electronic device and sensing device;
   (ii) the sensing device and the image sensor; and
   (iii) the circuit board and image sensor.

19. The sensor system of claim 18, wherein the sensing device comprises at least one transceiver that:
   (i) transmits a first wireless signal; and
   (ii) receives a second wireless signal to detect presence of an object relative to the electronic device, the second wireless signal being received in response to transmission of the first wireless signal and being associated with the first wireless signal.

20. The sensor system of claim 19, wherein the at least one transceiver of the sensing device is:
   disposed at least partially in a first depression of the housing, and disposed adjacent at least one lens of the one or more lenses included in the bore.

21. The sensor system of claim 18, wherein the sensing device comprises:
   (i) a transmitter that transmits a first wireless signal; and
   (ii) a receiver that receives a second wireless signal to detect presence of an object relative to the electronic device, the second wireless signal being received in response to transmission of the first wireless signal and being associated with the first wireless signal.

22. The sensor system of claim 21, wherein:
   the transmitter is disposed at least partially in a first depression of the housing and adjacent at least one side of the housing; and
   the receiver is disposed at least partially in a second depression of the housing and adjacent at least one side of the housing.

* * * * *